United States Patent

Vaes et al.

[11] Patent Number: 5,733,703
[45] Date of Patent: Mar. 31, 1998

[54] IMAGING ELEMENT AND METHOD FOR MAKING A LITHOGRAPHIC PRINTING PLATE ACCORDING TO THE SILVER SALT DIFFUSION TRANSFER PROCESS

[75] Inventors: Jos Vaes, Betekom; Luc Wabbes, Mortsel, both of Belgium

[73] Assignee: Agfa-Gevaert, N.V., Mortsel, Belgium

[21] Appl. No.: 569,425

[22] Filed: Dec. 8, 1995

[30] Foreign Application Priority Data

Dec. 28, 1994 [EP] European Pat. Off. ............ 94203777

[51] Int. Cl.$^6$ ................ G03C 1/42; G03C 5/30; G03C 8/06; G03C 8/36
[52] U.S. Cl. .......... 430/204; 430/229; 430/234; 430/249; 430/436; 430/440; 430/480
[58] Field of Search ................ 430/222, 204, 430/234, 249, 440, 480, 436, 229

[56] References Cited

U.S. PATENT DOCUMENTS

| | | | |
|---|---|---|---|
| 3,615,440 | 10/1971 | Bloom | 96/20 |
| 3,821,000 | 6/1974 | Land et al. | 430/249 |
| 3,870,479 | 3/1975 | Kubotera et al. | 430/204 |
| 4,535,051 | 8/1985 | Simon et al. | 430/222 |
| 4,585,725 | 4/1986 | Sakaguchi | 430/232 |
| 5,268,253 | 12/1993 | Van Rompuy | 430/204 |
| 5,578,434 | 11/1996 | Moizo et al. | 430/480 |
| 5,648,205 | 7/1997 | Okutsu | 430/480 |

*Primary Examiner*—Richard L. Schilling
*Attorney, Agent, or Firm*—Breiner & Breiner

[57] ABSTRACT

The present invention provides an imaging element comprising on a support in the order given a photosensitive layer comprising a silver halide emulsion and an image receiving layer containing physical development nuclei in water permeable relationship with said emulsion layer, characterized in that said imaging element comprises at least 50 mg/m$^2$ of tetramethyl reductic acid and at least 100 mg/m$^2$ of ascorbic acid.

According to the present invention there is further provided a method for making a lithographic printing plate comprising the steps of image-wise exposing an imaging element as defined above and subsequently developing a thus obtained imaging element by an alkaline processing liquid in the presence of developing agent(s) and silver halide solvent(s).

10 Claims, No Drawings

IMAGING ELEMENT AND METHOD FOR MAKING A LITHOGRAPHIC PRINTING PLATE ACCORDING TO THE SILVER SALT DIFFUSION TRANSFER PROCESS

FIELD OF THE INVENTION

The present invention relates to a method for making a lithographic printing plate according to the silver salt diffusion transfer process.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York. (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background. For example, typical lithographic printing plates are disclosed in EP-A-423,399 and EP-A-410,500.

The DTR-image can be formed in the image-receiving layer of a sheet or web material which is a separate element with respect to the photographic silver halide emulsion material (a so-called two-sheet DTR element) or in the image-receiving layer of a so-called single-support element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in a lithographic printing process using a dampening liquid.

As for other printing plates it is required that the printing plates obtained according to the DTR-process have a high printing endurance, good ink acceptance in the printing areas and no ink acceptance in the non-printing areas (no staining). An appropriate sensitometry, particularly a low minimum density with a high gradient of the printing plate is therefore required.

Furthermore the processing of the exposed imaging element in order to obtain a printing plate comprises the step of developing said exposed imaging element using an alkaline processing liquid in the presence of developing agent(s) and silver halide solvent(s). In most modern DTR materials, the developing agents are completely or at least for the greater part comprised in the imaging element. Nowadays hydroquinone or a derivative thereof are used as developing agent. These compounds are from an ecological viewpoint not interesting. So the use of other more ecologically friendly developing agents is desirable. Ascorbic acid is such an ecologically friendly developer but the results when using ascorbic acid as the developer in the processing of a lithographic printing plate precursor according to the silver salt diffusion were unsatisfactory.

SUMMARY OF THE INVENTION

It is an object of the present invention to provide an imaging element and method for making a lithographic printing plate therewith according to the DTR-process, said printing plate having an improved sensitometry, particularly a low minimum density with a high gradient.

It is a further object of the present invention to provide an imaging element and method for making a lithographic printing plate therewith according to the DTR-process, said imaging element comprising ecologically friendly developers.

Still further objects of the present invention will become clear from the description hereinafter.

According to the present invention there is provided an imaging element comprising on a support in the order given a photosensitive layer comprising a silver halide emulsion and an image receiving layer containing physical development nuclei in water permeable relationship with said emulsion layer, characterized in that said imaging element comprises at least 50 mg/m$^2$ of tetramethyl reductic acid and at least 100 mg/m$^2$ of ascorbic acid.

According to the present invention there is further provided a method for making a lithographic printing plate comprising the steps of image-wise exposing an imaging element as defined above and subsequently developing a thus obtained imaging element by an alkaline processing liquid in the presence of developing agent(s) and silver halide solvent(s).

DETAILED DESCRIPTION OF THE INVENTION

According to the present invention it has been found that a lithographic printing plate prepared according to the DTR-process from an imaging element comprising in the imaging element at least 50 mg/m$^2$ of tetramethyl reductic acid and at least 100 mg/m$^2$ of ascorbic acid has a low minimum density with a high gradient.

According to the invention said imaging element comprises in the imaging element at least 50 mg/m$^2$, preferably at least 100 mg/m$^2$, more preferably at least 200 mg/$^2$ of tetramethyl reductic acid. The upper limit is not so important but is preferably not higher than 1 g/m$^2$. Also according to the invention said imaging element comprises at least 100 mg/m$^2$, preferably at least 200 mg/m$^2$, more preferably at least 400 mg/m$^2$ of ascorbic acid. The upper limit is not so important but is preferably not higher than 1 g/m$^2$.

Preferably said reducing agents are comprised in the photosensitive layer and/or in the image receiving layer. More preferably said at least 50 mg/m$^2$ of tetramethyl reductic acid is comprised in either the photosensitive layer or in the image receiving layer and said at least 100 mg/m$^2$ of ascorbic acid in the other of these two layers. Still more preferably at least 50 mg/m$^2$ of tetramethyl reductic acid is comprised in the photosensitive layer and at least 100 mg/m$^2$ of ascorbic acid is comprised in the image receiving layer.

Most preferably all of the tetramethyl reductic acid is comprised in the photosensitive layer and all of the ascorbic acid is comprised in the image receiving layer.

The imaging element in connection with the present invention for preparing a lithographic printing plate essentially contains on a support in the order given a photosensitive layer containing a silver halide emulsion and an image receiving layer containing physical development nuclei in water permeable relationship with said emulsion layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminium may also be used in accordance with the present invention.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al. in "Making and Coating Photographic Emulsion", The Focal Press, London (1966).

According to the present invention the emulsion or emulsions preferably consist principally or totally of silver chloride while a fraction of silver bromide is present ranging from 1 mole % to 40 mole %. When the fraction of silver bromide is 5% or more, the emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 µm, preferably from 0.25 to 0.45 µm.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R.KOSLOWSKY, Z. Wiss. Photogr. Photophys. Photothem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.e. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual stabilizers. Suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,785 and DE-P 2,453,217.

More details about the composition, preparation and coating of silver halide emulsions can be found in e.g. Product Licensing Index, Vol. 92, December 1971, publication 9232, p. 107–109.

The layer containing physical development nuclei can be free of hydrophilic binder but preferably comprises amounts up to 80% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

Between the support and the silver halide emulsion layer there is preferably provided a base layer that preferably contains an anti-halation substance such as e.g. light-absorbing dyes absorbing the light used for image-wise exposure of the imaging element. As alternative finely divided carbon black can be used as an anti-halation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have an average diameter of 2–10 μm and more preferably between 2 μm and 5 μm. The matting agents are generally used in a total amount in the imaging element of 0.1 g/m$^2$ to 2.5 g/m$^2$. At least part of these matting agents and/or light reflection pigments may also be present in the silver halide emulsion layer and/or in the cover layer. As a further alternative the light reflecting pigments may be present in a separate layer provided between the antihalation layer and the photosensitive silver halide emulsion layer. Like the emulsion layer the base layer is coated preferably at a pH value near the isoelectric point of the gelatin in the base layer.

In a preferred embodiment in connection with the present invention a backing layer is provided at the non-light sensitive side of the support. This layer which can serve as anti-curl layer can contain i.e. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the theological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Examples of suitable surface-active agents are described in e.g. EP 545452. Preferably compounds containing perfluorinated alkyl groups are used.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth) acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth) acrylates, sulphoalkyl (meth)acrylates, and styrene sulphonic acids.

The above described DTR mono-sheet imaging element in connection with the present invention is exposed in an apparatus according to its particular application, e.g. a conventional process camera containing a conventional light source or a high intensity short time exposure such as e.g. a laser containing device. Subsequently the imaged element is developed with an alkaline processing liquid in the presence of developing agent(s) and silver halide solvent(s).

Silver halide developing agents for use in accordance with the present invention are ascorbic acid and tetramethyl reductic acid, which may be and preferably are used in combination with one or more auxiliary developing agents being a 1-phenyl-3-pyrazolidone-type developing agent and/ or p-monomethylaminophenol. Particularly useful auxiliary developing agents are of the 1-phenyl-3-pyrazolidone type. e.g. 1-phenyl-3-pyrazolidone, 1-phenyl-4-monomethyl-3-pyrazolidone, 1-phenyl-4,4-dimethyl-3-pyrazolidone and 1-phenyl-3-pyrazolidones of which the aqueous solubility is increased by a hydrophilic substituent such as e.g. hydroxy, amino, carboxylic acid group, sulphonic acid group etc. Examples of 1-phenyl-3-pyrazolidones subsituted with one or more hydrophilic groups are e.g. 1-phenyl-4-methyl-4-hydroxymethyl-3-pyrazolidone, 1-phenyl-4,4'-dihydroxymethyl-3-pyrazolidone, 1-(4-carboxyphenyl)-4,4-dimethyl-3-pyrazolidone etc. Other developing agents can be used. Said developing agents may be contained in an alkaline processing liquid with the understanding that according to the present invention the imaging element comprises at least 50 mg/m$^2$ of tetramethyl reductic acid and at least 100 mg/m$^2$ of ascorbic acid. However the developing agents are preferably in their totality contained in one or more layers of the imaging element. In the latter case the alkaline processing liquid merely serves as an alkaline activating liquid.

Preferably the development is carried out in the substantial absence of developing agents of the p-dihydroxybenzene type such as hydroquinone, methylhydroquinone or chlorohydroquinone. In the substantial absence means that the amount of developing agents of the p-dihydroxybenzene type is in the imaging element less than 25 mg/m² and in the alkaline processing solution less than 0.5 g/l.

Development acceleration can be accomplished with the aid of various compounds added to the alkaline developing solution and/or one or more layers of the photographic element, preferably polyalkylene derivatives having a molecular weight of at least 400 such as those described in e.g. U.S. Pat. Nos. 3,038,805—4,038,075— 4,292,400—4,975,354.

Suitable silver complexing agents also called silver halide solvents for use in accordance with the present invention are e.g. thiosulphate or thiocyanate in an amount ranging from 5 g to 20 g per liter. Other interesting silver halide complexing agents are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers, preferably di- or poly-thioethers as disclosed in e.g. U.S. Pat. No. 4,960,683 and EP-A 554,585.

Still further suitable silver halide solvents are meso-ionic compounds, preferably 1,2,4-triazolium-3-thiolates as disclosed in e.g. EP-A 554,585.

Combinations of different silver halide solvents can be used and it is also possible to incorporate at least one silver halide solvent into a suitable layer of the imaging element and to add at least one other silver halide solvent to the developing or activating solution. Preferably they are comprised in the alkaline processing liquid.

The pH of said alkaline liquid is preferably between 9 and 14, more preferably between 10 and 13 and may be established by an organic and/or inorganic alkali agent. Examples of suitable alkali agents are e.g. sodium hydroxide, carbonates, phosphates, alkanolamines or mixtures thereof.

The alkaline processing liquid preferably also contains a preserving agent having antioxidation activity, e.g. sulphite ions. Further may be present a thickening agent, fog inhibiting agents e.g. a benzotriazole which is known to improve the printing endurance, calcium-sequestering compounds, anti-sludge agents, development accelerators and hardeners including latent hardeners.

The development step is preferably followed by a neutralization of the surface of the imaged element by guiding the element through a neutralization liquid having a pH between 4 and 8. The neutralization liquid preferably contains a buffer e.g. a phosphate buffer, a titrate buffer, an amine or a mixture thereof. The neutralization solution can further contain bactericides, e.g. phenol, thymol or 5-bromo-5-nitro-1,3-dioxan as described in EP-150,517, wetting agents e.g. saponins or pluronics etc. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

According to the present invention the alkaline processing and/or neutralizing solution preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Preferred hydrophobizing agents are mercapto-1,3,4-thiadiazoles as described in DE-A 1,228,927 and in U.S. Pat. No. 4,563,410, 2-mercapto-5-alkyl-oxa-3,4-diazole and long chain (at least 5 carbon atoms) alkyl substituted mercaptotetrazoles. Particularly preferred compounds are 5-n-heptyl-2-mercapto-1, 3,4,-oxadiazol and 3-mercapto-4-acetamido-5-n-heptyl-1,2, 4-triazole.

A lithographic printing plate is thus obtained.

The invention will now be illustrated by the following examples without however the intention to limit the invention thereto. All parts are by weight unless otherwise specified.

EXAMPLE 1

Preparation of the silver halide emulsion coating solution.

A silver chlorobromide emulsion composed of 98.2 mole % of chloride and 1.8 mole % of bromide was prepared by the double jet precipitation method. The average silver halide grain size was 0.4 µm (diameter of a sphere with equivalent volume) and contained Rhodium ions as internal dopant. The emulsion was orthochromatically sensitized and stabilized by a 1-phenyl-5-mercapto-tetrazole.

A base layer coating solution was prepared having the following composition:

| gelatin | 5.5% |
|---|---|
| carbon black | 0.76% |
| silica particles (5 µm) | 1.6% |

Preparation of the imaging element I:

The emulsion coating solution, whereto was added tetramethyl reductic acid and base layer coating solution were simultaneously coated by means of the slide hopper coating technique to a polyethylene terephthalate support provided with a pack of two backing layers such that the base layer coating was coated directly to the side of the support opposite to the side containing said backing layers. The emulsion layer was coated such that the silver halide coverage expressed as AgNO$_3$ was 1.5 g/m², the tetramethyl reductic acid content was 234 mg/m² and the gelatin content was 1.5 g/m². The base layer was coated such that the amount of gelatin in the coated layer was 3 g/m².

The layer nearest to the support of the backing layer pack contained 0.3 g/m² of gelatin and 0.5 g/m² of the antistatic agent co(tetraallyloxyethane/methacrylate/acrylic acid-K-salt) polymer. The second backing layer contained 4 g/m² of gelatin, 0.15 g/m² of a matting agent consisting of transparent spherical polymeric beads of 3 micron average diameter according to EP 80,225, 0.05 g/m² of hardening agent triacrylformal and 0.021 g/m² of wetting agent $F_{15}C_7$-COONH$_4$.

The thus obtained element was dried and subjected to a temperature of 40° C. for 5 days and then the emulsion layer was overcoated with a layer containing PdS as physical development nuclei, tetramethyl reductic acid at 510 mg/m² and formaldehyde at 100 mg/m².

Preparation of the imaging element II:

This imaging element was prepared in an identical way as imaging element I with the exception that tetramethyl reductic acid was replaced by ascorbic acid in the emulsion coating solution in an amount of 234 mg/m² and in the layer containing PdS as physical development nuclei at 510 mg/m².

Preparation of the imaging element III:

This imaging element was prepared in an identical way as imaging element I with the exception that tetramethyl reductic acid was replaced by ascorbic acid in the layer containing PdS as physical development nuclei at 510 mg/m².

The following alkaline processing solutions were prepared:

| Sodium hydroxide (g) | 30 | 30 | 30 |
|---|---|---|---|
| Sodium sulphite anh. (g) | 33 | 33 | 15 |
| Potassium thiocyanate (g) | 18 | 18 | 0 |
| 3-mercapto-4-acetamido-5-n.heptyl-1,2,4 triazole (g) | 0.15 | 0.15 | 0.15 |
| Sodium thiosulphate anh. (g) | 0 | 2 | 0 |
| Amino-ethyl-amino-ethanol (ml) | 0 | 0 | 10 |
| Thiosalicylic acid (g) | 0 | 0 | 0.060 |
| Uracil (g) | 0 | 0 | 0.850 |
| Water to make (l) | 1 | 1 | 1 |

Neutraliation solution

| citric acid | 10 g |
|---|---|
| sodium citrate | 35 g |
| sodium sulphite anh. | 5 g |
| phenol | 50 mg |
| water to make | 1 l |

Three samples of each of the above described imaging elements I to III were image-wise exposed and processed at 25° C. respectively one of each imaging element in each of the above described alkaline developing solution A to C, subsequently neutralized at 25° C. with the neutralization solution described above and dried. The resulting sensitometry of the 9 samples is given in table 2.

TABLE I

| Sensitometry | | | |
|---|---|---|---|
| Developing Solution | Imaging Element | $D_{min}$ | $G^a$ |
| A | I | 73 | —b) |
| A | II | 82 | 1.02 |
| A | III | 67 | 1.05 |
| B | I | 78 | —c) |
| B | II | 76 | 1.17 |
| B | III | 61 | 1.41 |
| C | I | 84 | —c) |
| C | II | 75 | 1.12 |
| C | III | 55 | 1.15 |

Remark:
a)G: gradient between 25% and 75% of the density difference
b)gradient is lower than 1.0
c)gradient is lower than 1.10

It is clear from the results of table 2 that an exposed imaging element III, comprising tetramethyl reductic acid in the emulsion coating solution in an amount of 234 mg/m² and ascorbic acid in the layer containing PdS as physical development nuclei at 510 mg/m² (imaging element according to the invention) by development in the three activating solutions A to C gave a printing plate with a clearly lower minimum density and an even higher gradient than the printing plates obtained by development of exposed imaging elements, containing in said layers respectively only tetramethyl reductic acid (imaging element I: comparison) or ascorbic acid (imaging element II: comparison).

We claim:

1. An imaging element comprising on a support in the order given a photosensitive layer comprising a silver halide emulsion and an image receiving layer containing physical development nuclei in water permeable relationship with said emulsion layer, characterized in that said imaging element comprises at least 50 mg/m² of tetramethyl reductic acid and at least 100 mg/m² of ascorbic acid.

2. An imaging element according to claim 1 wherein said imaging element comprises at least 100 mg/m² tetramethyl reductic acid.

3. An imaging element according to claim 1 wherein said imaging element comprises at least 200 mg/m² of ascorbic acid.

4. An imaging element according to claim 1 wherein said at least 50 mg/m² of tetramethyl reductic acid is comprised in either the photosensitive layer or in the image receiving layer and said at least 100 mg/m² of ascorbic acid in the other of these two layers.

5. An imaging element according to claim 1 wherein all of the tetramethyl reductic acid is comprised in the photosensitive layer and all of the ascorbic acid is comprised in the image receiving layer.

6. An imaging element according to claim 1 wherein said imaging element comprises less than 25 mg/m² of developing agents of the p-dihydroxybenzene type.

7. A method for making a lithographic printing plate comprising the steps of image-wise exposing an imaging element according to claim 1 and subsequently developing a thus exposed imaging element by an alkaline processing liquid in the presence of developing agent(s) and silver halide solvent(s).

8. A method according to claim 7 wherein said silver halide solvent is a thiocyanate salt.

9. A method according to claim 7 wherein said silver halide solvent is an aminoahohol.

10. A method according to claim 7 wherein said developing step is carried out in the substantial absence of developing agents of the p-dihydroxybenzene type.

* * * * *